United States Patent [19]
Ishizuya et al.

[11] Patent Number: 5,416,344
[45] Date of Patent: May 16, 1995

[54] SOLID STATE IMAGING DEVICE AND METHOD FOR PRODUCING THE SAME

[75] Inventors: Tohru Ishizuya, Yokohama; Masahiro Shoda, Gyouda; Keiichi Akagawa, Kamakura, all of Japan

[73] Assignee: Nikon Corporation, Tokyo, Japan

[21] Appl. No.: 99,493

[22] Filed: Jul. 28, 1993

[30] Foreign Application Priority Data

Jul. 29, 1992 [JP] Japan .................................. 4-220983
Mar. 10, 1993 [JP] Japan .................................. 5-075070

[51] Int. Cl.⁶ ..................... H01L 29/78; H01L 27/14; H01L 31/00
[52] U.S. Cl. .................................. 257/228; 257/245; 257/247; 257/229; 257/436
[58] Field of Search ............... 257/222, 223, 228, 436, 257/245, 249, 229

[56] References Cited

FOREIGN PATENT DOCUMENTS 58-123760  7/1983  Japan ............................. 257/436
2-268465  11/1990  Japan ............................. 257/222

*Primary Examiner*—Jerome Jackson
*Assistant Examiner*—Donald L. Monin, Jr.
*Attorney, Agent, or Firm*—Keck, Mahin & Cate

[57] ABSTRACT

A solid state imaging device which reduces the occurrence of crosstalk between a plurality of picture elements arranged in a linear or matrix form. The solid state imaging device includes a plurality of photosensitive cells formed on a first principal surface of a semiconductor substrate, a transfer electrode formed in a gap area among the cells on the first principal surface to read out charges produced in the cells, a drive metal wiring formed on the transfer electrode within the gap area, a first insulating film covering the cells with a predetermined thickness, and a plurality of metal reflecting films formed on the first insulating film in such a manner that the whole surface of each of the metal reflecting films forms a reflecting surface substantially parallel to a surface of each of the cells on the side of the first principal surface whereby light passed through the photosensitive cells from a side opposite to the first principal surface is reflected back to each of the photosensitive cells.

17 Claims, 8 Drawing Sheets

PRIOR ART

SOLID STATE IMAGING DEVICE AND METHOD FOR PRODUCING THE SAME

BACKGROUND OF THE INVENTION

1. Field of the Invention

The present invention relates to a solid state imaging device, e.g., an infrared solid state imaging device or the like including a semiconductor substrate and a plurality of photosensitive cells formed by depositing on the semiconductor substrate a conductive material which is different from the substrate, and more particularly the invention relates to such solid state imaging device in which each of the cells further includes a reflecting film for reintroducing the passed light into its photosensing portion, and a method for producing the same.

2. Description of the Prior Art

An infrared solid state imaging device is an example of solid state imaging devices of the type including a plurality of photosensitive cells formed on a semiconductor substrate by depositing a material different from the substrate on it, each of said cells being provided with a reflecting film for reintroducing the passed light into its photosensing portion.

As is well known in the art, this type of solid state imaging device must satisfy a requirement that "the incident light on each of the picture elements or the photosensitive cells must be photoelectrically converted by the picture element alone". If the light incident on one picture element is photoelectrically converted by another picture element (this phenomenon is referred to as a "crosstalk"), there is the disadvantage that an output image is different from the original image formed on the solid state imaging device and the solid state imaging device fails to attain its essential purposes.

A disadvantage of the conventional solid state imaging device resides in that the previously mentioned crosstalk cannot be prevented fully and an excellent image cannot be produced.

In detail, according to the conventional production process of the solid state imaging device, signal charge transfer units of the CCD type or the like are formed firstly on the surface of a semiconductor substrate and metal electrodes for driving the units are formed on the units, and then the photosensitive cells serving as picture elements are formed on the substrate. Thereafter, the electrodes and the cells are covered by an insulating film layer, and the surface of the insulating film layer is flattened to form the previously mentioned metal reflecting films on the portions of the flattened surface of the insulating film corresponding to the photosensitive cells.

In this case, the insulating film layer is composed of an oxide film formed for example by the CVD (chemical vapor deposition) process to a thickness of about 4,000 to 10,000 angstrom and its surface shape is flattened when subjected to a heat treatment at a temperature of about 900° C. The flattening by such heat treatment is widely known as a reflow treatment and this is effective in the prevention of electrical faults (breaking, short-circuiting, etc.,) of aluminum wiring formed on the oxide film by the following operation.

On the other hand, while each metal reflecting film should preferably include a reflecting surface of as flat as possible in parallel to the photosensitive cell, after the insulating film layer has been subjected to the flattening treatment, the surface shape of the recess of each photosensitive cell portion formes a curved surface, particularly at the marginal portions of the photosensitive cell and therefore the reflecting surface of the metal reflecting film formed on the photosensitive cell is correspondingly formed into a curved surface at the marginal portions of the reflecting surface.

The reflecting surface having such a curved surface cannot return all of its incident light to the original optical path so that a part of the light reflected by the curved surface is directed to the photoelectric conversion portion of the adjoining different photosensitive cell and this results in the generation of a pseudo signal due to the crosstalk of the light between the adjoining picture elements, thereby causing a bleeding of the resulting image.

Another problem of the conventional solid state imaging devices is derived from the fact that particularly in recent years the various solid state imaging devices including the infrared solid state imaging device are required from all quarters to fulfil such performance that the chip size is reduced further, the spatial resolution is increased further (hence the number of picture elements is increased further) and the photosensitivity is enhanced further at the same time.

In order to satisfy these requirements, it is necessary to increase the area ratio (opening ratio) occupied by a photosensitive cell within each unit picture element of the solid state imaging device, and various attempts have been made for this purpose. Decreasing the width of an isolation area composed of an oxide insulating layer formed for example by an LOCOS (localized oxidation of silicon) process to electrically isolate each photosensitive cell from the surroundings within a semiconductor substrate and decreasing the width of BCCD diffused layers formed adjacent to the photosensitive cells for charge transfer purposes may be cited as examples of such attempts. However, each of such attempts alone cannot fully increase the opening ratio of the photosensitive cells and thus it is difficult to obtain an imaging device having a high photosensitivity.

Then, while it is desirable to form by etching a wide opening of a sufficient area in the insulating film during the formation of the photoelectric conversion portion of the photosensitive cell, the conventional manufacturing methods of solid state imaging devices inevitably cause the occurrence of side etching in the case of relatively thick insulating films (of about 4,000 to 10,000 angstrom) so that if the opening formed in the resist layer for the purpose of etching is so large, the side etching of the insulating film results in the exposure of the CCD electrode adjoining the photosensitive cell and thus there is a limitation to increasing the opening ratio of the photosensitive cells from the structural point of view.

Another disadvantage of the conventional solid state imaging device is the danger of the plurality of photosensitive cells becoming nonuniform in characteristic and more particularly there have been the cases where the photosensitive cells are changed in characteristic during the cleaning of the imaging device, its assembling to a camera and its replacement.

In accordance with the studies made by the inventors, such nonuniformity and variation in the photosensitive characteristic of the plurality of photosensitive cells are caused by the fact that there is caused the electrification by static electricity or a negative charge of the metal reflecting film facing through the insulating film the photoelectric conversion portion composed of a semiconductor Schottky junction or the like in each photosensitive cell and the dark current in the photoelectric conversion portion is varied to increase or decrease by the charged potential, thereby causing the increased dark current to add a pseudo signal to the essential signal charge photoelectrically converted by the photosensitive cell.

For instance, during the manufacture of an imaging device a silicon wafer serving as a semiconductor substrate is cleaned by the high pressure spraying of pure water (the specific resistance is 18 megohm or over) from which various ions have been removed. When a jet stream of cleaning water having such a high specific resistance is sprayed against the wafer, static electricity is generated and therefore the metal reflecting films formed on the wafer through the insulating film are electrified with negative charges.

SUMMARY OF THE INVENTION

It is the primary object of the present invention to overcome the foregoing deficiencies in the prior art and more particularly to provide a solid state imaging device which satisfactorily prevents the occurrence of crosstalk, is capable of producing an excellent image and is also high in photosensitivity.

It is another object of the present invention to provide a solid state imaging device which improves the opening ratio of its photosensitive cells without the occurrence of electrical failure and is high in photosensitivity or photosensitive yield.

It is still another object of the present invention to provide a solid state imaging device which maintains its plurality of photosensitive cells uniform in characteristic and eliminates the effect of variation in the characteristics of the photosensitive cells during its cleaning, assembling to a camera and replacement.

In accordance with one aspect of the present invention there is thus provided a solid state imaging device comprising:

a semiconductor substrate having a first principal surface and a second principal surface which are opposite to each other, a plurality of photosensitive cells which are formed on the side of the first principal surface of the semiconductor substrate and are each surrounded by a insulating dielectric isolation layer, electrode means formed in the gap area among the plurality of photosensitive cells to transfer charges produced below the first principal surface of the semiconductor substrate to the outside, a first insulating film covering the area containing the plurality of photosensitive cells with substantially a uniform thickness, a plurality of metal reflecting films formed on the first insulating film so as to each form a reflecting surface by its whole surface which is substantially parallel to the surface of one of the photosensitive cells on the first principal surface side and thereby to reflect the light passed through the photosensitive cells from the second principal surface of the semiconductor substrate back to the photosensitive cells, a second insulating film covering an area containing the electrode means and the metal reflecting films and having a flattened surface, and a metal wiring formed on the flattened surface of the second insulating film for driving the electrode means.

The semiconductor substrate should preferably be a silicon substrate and in this case each of the photosensitive cells includes a semiconductor Schottky junction formed by a metal silicide deposited on one of the exposed first principal surface portions of the silicon substrate.

In accordance with another aspect of the present invention there is provided a method for producing such solid state imaging device including:

a first step of forming a plurality of cell regions on a first principal surface of a semiconductor substrate so as to be spaced from one another, each of the cell regions being surrounded by a dielectric isolation layer, a second step of forming electrode means in a space area among the plurality of cell regions for transferring charges produced below the first principal surface of the semiconductor substrate to the outside, a third step of exposing the first principal surface within each of the plurality of cell regions, a fourth step of depositing an electrically conductive material different from the semiconductor substrate on the exposed first principal surface within each of the cell regions to form a photosensitive cell on the inner side of each of the cell regions, a fifth step of covering an area containing the photosensitive cells with a first insulating film having a substantially uniform thickness, a sixth step of forming, on the first insulating film without flattening it by a reflow treatment, a plurality of metal reflecting films for reflecting the light passed through the photosensitive cells from inside the semiconductor substrate back to the plurality of photosensitive cells, each of the metal reflecting films having the whole surface thereof faced to one of the photosensitive cells in a substantially parallel manner, a seventh step of covering an area containing the electrode means and the metal reflecting films with a second insulating film and flattening a surface of the second insulating film, and an eighth step of forming a metal wiring for driving the electrode means on the flattened surface of the second insulating film.

A silicon substrate is preferably used for the semiconductor substrate and in this case the fourth step may include the step of depositing the conductive material on each of the exposed first principal surface portions of the silicon substrate to form a semiconductor Schottky junction.

Also, the fifth step may include the step of forming the first insulating film by any of the atmospheric pressure CVD process, the plasma CVD process, the low pressure CVD process and the sputtering process.

Further, the seventh step may include the step of forming any of a polyimide film, a spin-on glass film and an oxide film by the CVD process as the second insulating film.

In accordance with another aspect of the present invention there is provided a method for producing such solid state imaging device including:

a first step of forming a plurality of cell regions which are spaced apart from one another and each surrounded by a dielectric isolation layer on the side of a first principal surface of a semiconductor substrate, a second step of forming electrode means for transferring charges produced below the first principal surface of the semiconductor substrate in a gap area among the plurality of cell regions, a third step of covering an area containing the plurality of cell regions with a first insulating film, a fourth step of exposing the frist principal surface within each of the cell regions, a fifth step of depositing an electrically conductive material different from the semiconductor substrate on the exposed first principal surface within each of the cell regions to form a photosensitive cell on the inner side of each of the cell regions, a sixth step of covering an area containing the plurality of photosensitive cells with a second insulating film of a substantially uniform thickness, a seventh step of forming, on the second insulating film without flattening it by a reflow treatment, a plurality of metal reflecting films for reflecting the light passed through the photosensitive cells from inside the semiconductor substrate back to the photosensitive cells, each of the metal reflecting films having the whole surface faced toward one of the photosensitive cells in a substantially parallel manner, an eighth step of covering an area containing the electrode means and the metal reflecting films with a third insulating film and flattening a surface of the third insulating film, and a ninth step of forming a metal wiring for driving the electrode means on the flattened surface of the third insulating film.

A silicon substrate is preferably used as the semiconductor substrate and in this case the fifth step may include the step of depositing the conductive material on each of the exposed first principal surface portions of the silicon substrate to form a semiconductor Schottky junction.

Also, the sixth step may include the step of forming the second insulating film by any of the atmospheric pressure CVD process, the plasma CVD process, the low pressure CVD process and the sputtering process.

Further, the eighth step may include the step of forming any of a polyimide film, a spin-on glass film and an oxide film by the CVD process as the third insulating film.

With the above-mentioned solid state imaging device production methods according to the respective aspects of the present invention, in the condition where the insulating film covering the photosensitive cells is not subjected to any surface flattening treatment, that is, in the condition where there are no "sags and runners" of the insulating film material caused at the stepped portions of the photosensitive cell marginal portions by the reflow treatment, the metal reflecting films are formed on the insulating film so that differing from the case of the device by the conventional method, the marginal portions of each metal reflecting film are not formed into curved surfaces and it has a uniformly flattened reflecting surface shape over the whole region of corresponding one of the photosensitive cells.

Thus, with the imaging device made by the production method according to the present invention, the light transmitted through the photosensitive cells is returned to the photosensitive cells and subjected to photoelectric conversion and therefore there is no danger of causing any crosstalk as in the case of an imaging device made by the conventional production method, thereby ensuring an excellent image. Further, of the light transmitted through the photosensitive cells, only the extremely small part of it fails to be directed again to the photosensitive cells and therefore the photosensitivity is also enhanced over that of the conventional imaging device.

In accordance with the present invention, the insulating film covering the surface of the photosensitive cells should be made of an insulating film tending not to cause any "sags and runners" of the insulating film material at the stepped portions, preferably an oxide film, an oxide nitride film or a nitride film which can be obtained at a relatively low temperature of 500° C. or less so as to prevent any thermal loss of the photosensitive cells by means of the atmospheric pressure CVD process, the plasma CVD process, the low pressure CVD process or the sputtering process.

In accordance with the present invention, as mentioned previously, the formation of the reflecting films is effected prior to the flattening of the surface of the insulating film covering the surface of the photosensitive cells and therefore the surface of the insulating film is subjected to the flattening treatment after the metal reflecting films have been formed. In this case, it is possible to effect the flattening treatment at a relatively low temperature suitably selected in accordance with the heat-resistance temperatures of the photosensitive cells and the reflecting films and thereby to prevent any electric failure of the metal wiring formed later on the insulating film.

In this case, as such insulating film whose surface can be flattened at a low temperature, it is preferable to use a polyimide film formed by applying a liquid resin by the spin coating and then subjecting it to a heat treatment, a spin-on glass (SOG) film or an oxide film by the CVD process, particularly a CVD oxide film employing a tetraethoxysilane (TEOS) as its principal raw material.

The reason is that these insulating films made by the low temperature treatments can flatten their surfaces at temperatures of below 500° C. which is lower than the conventional reflow treating temperatures (about 900° C.).

Thus, in accordance with the present invention there is provided a solid state imaging device which is capable of satisfactorily preventing any crosstalk and ensuring an excellent image and is high in sensitivity.

In accordance with still another aspect of the present invention there is provided a method for producing a solid state imaging device including:

a first step of forming a plurality of cell regions which are spaced from one another and are each surrounded by a dielectric isolation layer on the side of a first principal surface of a semiconductor substrate, a second step of forming electrode means for transferring charges produced below the first principal surface of the semiconductor substrate to the outside in a space area among the plurality of cell regions, a third step of exposing the first principal surface within each of the plurality of cell regions subsequent to the second step, a fourth step of depositing an electrically conductive material different from the semiconductor substrate on the exposed first principal surface within each of the cell regions and forming a photosensitive cell on the inner side of each of the cell regions, a fifth step of covering an area containing the photosensitive cells and the electrode means with an insulating film and then flattening a surface of the insulating film, and a sixth step of forming a metal wiring for driving the electrode means on the flattened surface of the insulating film.

The production method according to this aspect is applicable to a variety of solid state imaging devices for the purpose of particularly improving the opening ratio of the photosensitive cells.

Where a silicon substrate is used as the semiconductor substrate, the fourth step may include the step of depositing the conductive material on each of the exposed first principal surface portion of the silicon substrate to form a semiconductor Schottky junction.

Also, the fifth step may include the step of forming a polyimide film, a spin-on glass film or an oxide film by the CVD process as the insulating film.

In accordance with the present invention, prior to the formation of the thick insulating film (usually the CVD oxide film of about 4,000 to 10,000 angstrom in thickness), the semiconductor substrate surface is exposed at every element active region where the photoelectric conversion portion of the photosensitive cell is formed. During the wet etching operation for this purpose, it is only necessary to remove the thin thermal oxide film (usually about 500 to 1,500 angstrom in thickness) grown on the surface of each element active region and therefore the amount of side etching is also reduced to a very small value (about 0.1 to 0.3 $\mu$m).

Therefore, in accordance with the present invention the opening edges of the photoelectric conversion portion of each photosensitive cell are brought as close as possible to the isolation region surrounding the cell so that the area opening ratio of the cell within the unit picture element can be increased considerably than previously.

Also, in accordance with the present invention, as mentioned previously, while the formation of the photosensitive cells is effected prior to the formation of the insulating film and thus the insulating film is subjected to the flattening treatment after the photosensitive cells have been formed, in this case the flattening treatment can be performed at a temperature suitably selected in accordance with the heat-resistant temperature of the photosensitive cells so as to effect the flattening of the insulating film surface without causing deterioration of the photosensitive cells and this has the effect of preventing any electric failure of the metal wiring formed on the insulating film by the following operation.

As an example of such insulating film that can be flattened at a low temperature, a polyimide film formed by applying a liquid polyimide resin by the spin coating and then subjecting it to a heat treatment, a spin-on glass (SOG) film or an oxide film by the CVD process, particularly a CVD oxide film employing tetraethoxysilane (TEOS) as a main raw material may be cited. These insulating films can be subjected to the surface flattening treatment at a temperature of 500° C. or less which is lower than the conventional reflow treatment temperature (about 900° C.) and this is preferable from the standpoint of preventing any thermal damage of the photosensitive cells.

Thus, in accordance with the present invention, after the photosensitive cells have been formed, the thick insulating film is formed and its surface is flattened. Thus, in order to expose the semiconductor substrate surface at those regions which form photosensitive cells, it is only necessary to remove the thin oxide film by a wet etching thereby reducing the amount of side etching to an extremely small value. As a result, it is possible to form photosensitive cells of substantially the same area as the element active region where the photoelectric conversion portion of the photosensitive cell is to be formed and it is possible to produce a solid state imaging device which is high in opening ratio and excellent in photosensitivity. Further, in accordance with the present invention only the single operation is required for the formation of the desired insulating film, such as, a CVD oxide film, thus simplifying the production operations and contributing toward reducing the production cost.

In accordance with still another aspect of the present invention there is provided a solid state imaging device including:

a semiconductor substrate having a first principal surface and a second principal surface which are opposite to each other, a plurality of photosensitive cells which are formed on the first principal surface side of the semiconductor substrate and are each surrounded by a dielectric isolation layer, electrode means formed in a space area among the plurality of photosensitive cells to transfer charges produced below the first principal surface of the semiconductor substrate to the outside, a first insulating film covering an area containing the plurality of photosensitive cells with substantially a uniform thickness, a plurality of metal reflecting films formed on the first insulating film each so as to form by its whole surface a reflecting surface substantially parallel to the first principal surface-side surface of one of the photosensitive cells to reflect the light passed through the photosensitive cells from the second principal surface of the semiconductor substrate back to the photosensitive cells, a second insulating film covering an area containing the electrode means and the metal reflecting films and having a flattened surface, and a thin film of metal formed on the flattened surface of the second insulating film so as to face the plurality of metal reflecting films and thereby to maintain the potential of the metal reflecting films at a predetermined value.

In accordance with a preferred form of the device, the second insulating film includes a plurality of through holes respectively reaching the plurality of metal reflecting films and the thin film of metal is electrically connected to the plurality of metal reflecting films through the through holes, respectively, so that a predetermined voltage is externally applied to the plurality of metal reflecting films from the thin film of metal through the through holes.

In accordance with another preferred form of the device, the thin film of metal is insulated in terms of DC electricity and capacitively coupled in terms of AC electricity to the metal reflecting films by the second insulating film and thus each of the metal reflecting films can be maintained at a predetermined potential in accordance with a potential applied externally to the thin film of metal.

In accordance with still another aspect of the present invention there is provided a method for producing such solid state imaging device including:

a first step of forming a plurality of cell regions which are each surrounded by a dielectric isolation layer and are spaced from one another on the side of a first principal surface of a semiconductor substrate, a second step of forming electrode means in a space area among the plurality of cell regions so as to transfer charges produced below the first principal surface of the semiconductor substrate to the outside, a third step of exposing the first principal surface within each of the cell regions, a fourth step of depositing an electrically conductive material different from the semiconductor substrate on the exposed first principal surface portion within each of the cell regions to form a photosensitive cell on the inner side of each of the cell regions, a fifth step of covering an area containing the plurality of photosensitive cells with a first insulating film having an essentially uniform thickness, a sixth step of forming, on the first insulating film without flattening it by a reflow treatment, a plurality of metal reflecting films for reflecting the light passed through the photosensitive cells from inside the semiconductor substrate back to the photosensitive cells, each of the metal reflecting films having its whole surface faced to one of the photosensitive cells in a substantially parallel manner, a seventh step of covering an area containing the electrode means and the metal reflecting films with a second insulating film and further flattening a surface of the second insulating film, and an eighth Step of forming a thin film of metal for maintaining the plurality of metal reflecting films at a predetermined potential on the flattened surface of the second insulating film to face the metal reflecting films.

In this case, in accordance with a preferred form of the method the eighth step may include the step of providing the second insulating film with a plurality of through holes respectively reaching the metal reflecting films and the step of electrically connecting the thin film of metal to the metal reflecting films such that a predetermined external voltage is applied to the metal reflecting films from the thin film of metal through the through holes.

Also, in accordance with another preferred form of the method the eighth step may include the step of forming the thin film of metal so as to be insulated in terms of DC electricity and capacitively coupled in terms of AC electricity to the metal reflecting films by the second insulating film whereby the potential of each of the metal reflecting films is maintained at a predetermined value in accordance with a potential applied externally to the thin film of metal.

In accordance with still another aspect of the present invention there is provided a method for producing a solid state imaging device including:

a first step of forming a plurality of cell regions which are each surrounded by a dielectric isolation layer and are spaced from one another on a first principal surface of a semiconductor substrate, a second step of forming electrode means in a space area among the plurality of cell regions so as to transfer charges produced below the first principal surface of the semiconductor substrate to the outside, a third step of covering an area containing the cell regions with a first insulating film, a fourth step of exposing the first principal surface within each of the cell regions, a fifth step of depositing an electrically conductive material different from the semiconductor substrate on the exposed first principal surface within each of the cell regions to form a photosensitive cell on the inner side of each of the cell regions, a sixth step of covering an area containing the plurality of photosensitive cells with a second insulating film having a substantially uniform thickness, a seventh step of forming, on the second insulating film without flattening it by the reflow treatment, a plurality of metal reflecting films for reflecting the light passed through the photosensitive cells from inside the semiconductor substrate back to the photosensitive cells, each of the metal reflecting films having its whole surface faced to one of the photosensitive cells in substantially a parallel manner, an eighth step of covering an area containing the electrode means and the metal reflecting films with a third insulating film and further flattening a surface of the third insulating film, and a ninth step of depositing a thin film of metal for maintaining each of the metal reflecting films at a predetermined potential on the flattened surface of the third insulating film so as to face the metal reflecting films.

In this case, in accordance with a preferred form of the method the ninth step may include the step of providing the third insulating film with a plurality of through holes respectively reaching the metal reflecting films, and the step of electrically connecting the thin film of metal to the metal reflecting films so as to apply a predetermined external voltage to the metal reflecting films from the thin film of metal through the through holes.

Also, in accordance with another preferred form of the method the ninth step may include the step of forming the thin film of metal so as to be insulated in terms of DC electricity and capacitively coupled in terms of AC electricity to the metal reflecting films by the third insulating film whereby the potential of each of the metal reflecting films is maintained at a predetermined value in accordance with a potential applied externally to the thin film of metal.

In accordance with the present invention, in the solid state imaging device including the thin film of metal for maintaining the potential of each of the metal reflecting films at a predetermined value, even if the thin film of metal is formed for example to take the form of a fine wiring, it is in effect formed on the flattened surface of the insulating film and thus there is no danger of causing in the course such defects as breaking in the wiring and the like. Also, since the reflecting films are formed evenly on the uneven surface of the other insulating film in such a manner that the whole surface of each of the reflecting films faces one of the photosensitive cells, there is the effect of reducing the occurrence of crosstalk due to the oblique intersection of the reflected light to the photosensitive cells and increasing the opening ratio of the photosensitive cells.

Particularly, since the potential of each of the metal reflecting films is fixed at a predetermined value, there is no danger of the occurrence of nonuniformity and variation in photosensitive characteristic among the photosensitive cells.

In other words, where the thin film of metal is electrically connected to the plurality of metal reflecting films through the through holes, a DC potential can be externally applied to the thin film of metal so that the potential of each of the metal reflecting films facing the photoelectric conversion portion of one of the photosensitive cells through the insulating film is fixed in terms of DC current and maintained at a certain given positive potential. By so doing, it is possible to prevent the electrification of negative charges in the metal reflecting films due to static electricity.

Also, by applying a uniform positive potential to each of the metal reflecting films, it is possible for example to increase the junction withstand voltage of the semiconductor Schottky junction in the photoelectric conversion portion of each of the photosensitive cells thereby decreasing the dark current. As a result, the uniformity in characteristic among the photosensitive cells is ensured and the essential stable photosensitive characteristic can be restored and maintained even in the event of variation in the characteristics of the photosensitive cells during the cleaning, assembling to a camara or replacement of the imaging device.

On the other hand, where the metal thin film is formed so that it is insulated in terms of DC electricity and also capacitively coupled in terms of AC electricity to the plurality of metal reflecting films by the insulating film, the metal reflecting films respectively facing the photosensitive cells are electrostatically shielded by the metal thin film and the semiconductor and therefore the electrification of negative charges in the metal reflecting films due to static electricity is prevented.

In other words, assuming that C1 represents the electrostatic capacity between the metal thin film and the metal reflecting film and C2 represents the electrostatic capacity between the metal reflecting film and the semiconductor substrate, these electrostatic capacities are equivalently connected in series. Thus, if Vc represents the potential of the semiconductor substrate (or the photoelectric conversion portion by the semiconductor Schottky junction), Vb the potential of the metal reflecting film and Va the potential of the metal thin film biased for example to a predetermined positive DC potential through the wiring from the outside, the metal reflecting film and the metal thin film are capacitively coupled and the potential Vb of the metal reflecting film becomes as follows:

$$Vb=(C1 * Va+C2 * Vc)/(C1+C2)$$

Therefore, if a given potential which is more positive than Vc is applied as the bias voltage Va, the potential Vb of the metal reflecting film is always maintained at a given positive potential due to the capacitive coupling between it and the metal thin film. Thus, as for example, the junction withstand voltage of the semiconductor Schottky junction or the photoelectric conversion portion of the photosensitive cell is improved and the dark current is decreased. As a result, the uniformity in characteristic among the photosensitive cells is ensured and the essential stable photosensitive characteristic can be restored and maintained even in the event of variation in the characteristics of the photosensitive cells during the cleaning, assembling to a camera or replacement of the imaging device.

Generally, in this type of solid state imaging device the semiconductor Schottky junction forming the photoelectric conversion portion of each photosensitive cell has an essential junction thickness of as thin as less than 100 angstrom, for example, and thus in the event of the Schottky junction alone the junction withstand voltage is reduced to an extremely low value due to the concentration of the electric field in the surroundings of the junction. Thus, while, for this reason, the guard ring is formed by the diffusion of impurities into the surroundings of the semiconductor Schottky junction for the purpose of increasing the junction withstand voltage, if there exists any metal film facing the semiconductor Schottky junction so as to be capacitively coupled to it (i.e., the metal reflecting film corresponds to it), the junction withstand voltage is still varied by the potential of this facing metal film. It follows from this fact that if the metal reflecting film is electrified with a negative charge, its effect is such that the guard ring around the semiconductor Schottky junction no longer functions satisfactorily and the junction withstand voltage is reduced. While, as a solution for this, it is conceivable to take a measure such that the function of the guard ring is not affected by the potential of the facing metal film tending to be capacitively coupled to the semiconductor Schottky junction, in this case the overlap dimension of the Schottky junction and the guard ring must be increased or alternatively the impurity density of the guard ring must be increased. Either of these attempts results in reducing the effective area of the photoelectric conversion of the photosensitive cells and these attempts are merely contrary toward increasing and improving the sensitivity and resolution of the imaging device.

On the contrary, with the solid state imaging device according to the present invention, the plurality of metal reflecting films are each fixed at a predetermined potential by the metal thin film so that the occurrence of nonuniformity and variation in photosensitive characteristic among the photosensitive cells can be prevented without decreasing the effective area of the photoelectric conversion portion of each photosensitive cell and moreover the metal thin film is formed on the flattened surface of the insulating film, thereby preventing the occurrence of such defects as the break in the wiring even if it is formed in a fine wiring pattern.

The above and other objects, features and advantages of the present invention will become more apparent from the following description of some preferred embodiments shown for illustrative purposes without any intention of limitation when taken in conjunction with the accompanying drawings.

DESCRIPTION OF THE PREFERRED EMBODIMENTS

Prior to describing the embodiments of the present invention, the construction of a conventional device and its production method will now be described by way of an infrared solid state imaging device with reference to FIG. 1 and FIGS. 2a to 2f with a view to facilitating the understanding of the features and advantages of the present invention.

Figure 1:
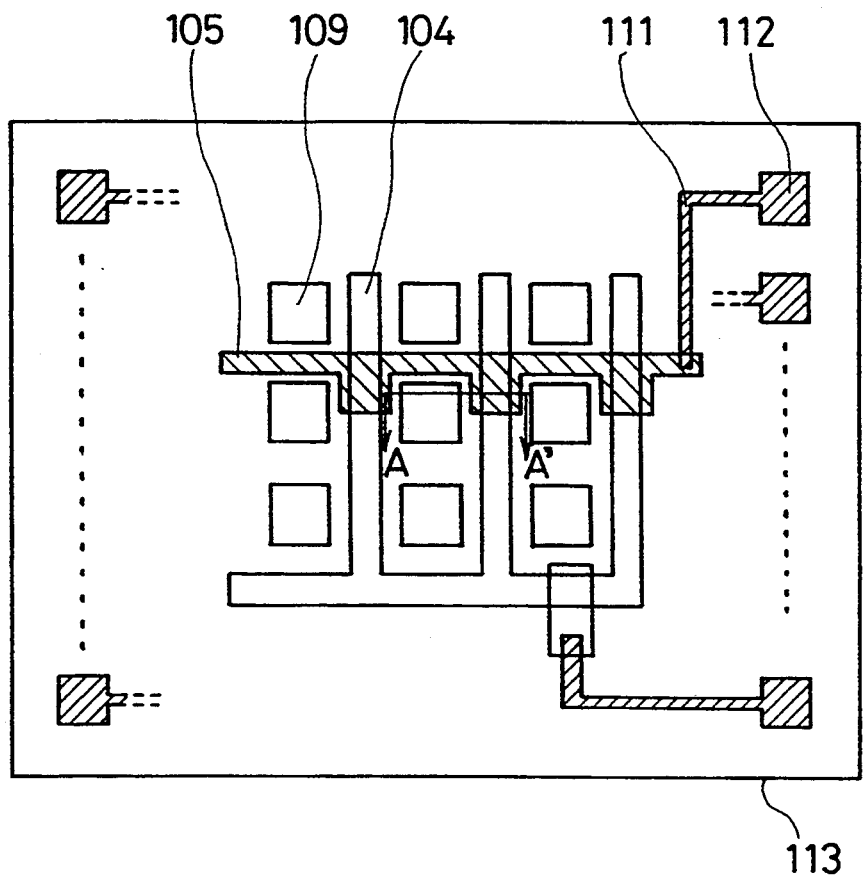
FIG. 1 is a plan view showing schematically the construction of a conventional solid state imaging device.

Referring first to FIG. 1, there is schematically illustrated a plane construction of an infrared solid state imaging device. In the Figure, photosensitive cells 109 are arranged in a matrix form on a semiconductor chip (substrate) 113. For purposes of simplifying the description, the 3 * 3=9 photosensitive cells are shown.

A charge transfer channel 104 for reading the charges produced in the photosensitive cells 109 is formed in the gap area among the photosensitive cells to extend along the three raws of the photosensitive cells. Actually, to read the charges requires that clock pulses are applied to a CCD transfer electrode 105 (indicated by the left-skew hatching in the Figure) formed on the charge transfer channel 104. It is to be noted that only the single CCD transfer electrode 105 is shown in the Figure and the remainder is omitted.

The clock pulses for the CCD transfer electrode 105 are applied from the outside of the semiconductor chip 113 through bonding pads 112 and metal wirings 111 (indicated by the right-skew hatching in the Figure) which are formed along the margin of the semiconductor chip 113. Note that in the Figure the bonding pads 112 and the metal wirings 111 are also shown in part. The bonding pads 112 and the metal wirings 111 are each made of a deposited layer of metal such as aluminum or aluminium alloy.

The method for producing a solid state imaging device of such construction as shown in FIG. 1 will now be described with reference to FIGS. 2a to 2f. FIGS. 2a to 2f are partial sectional views taken along the line A-A' of FIG. 1 showing the construction of the device near the chip surface according to the processing steps.

Firstly, isolation regions 102 composed of a relatively thick thermal oxide film is formed on a silicon substrate 101 by the heretofore known LOCOS isolation process (localized oxidation of silicon isolation process).

Figure 2A:
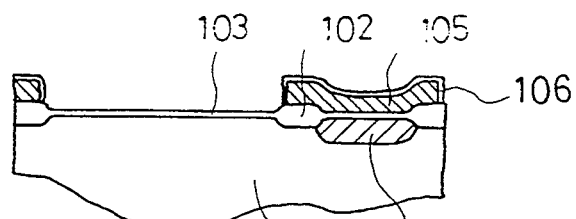
FIGS. 2a to 2f are partial sectional views showing the construction of a solid state imaging device at various stages of its production process according to a conventional method.

Then, BCCD diffused layers 104a are formed in a charge transfer channel (104 in FIG. 1) and then CCD transfer electrodes 105 made of polysilicon are formed on the diffused layers 104a. In addition, though not shown in the Figures, all of the various diffused layers such as source-drain diffused layers constituting MOS transisters which serve as an output section of the charge transfer channel and all of the polysilicon electrodes are formed. FIG. 2a shows the condition where the formation of the thermal diffused layers and the polysilicon electrodes has been completed. In this condition, the region which is to form a photosensitive cell and the polysilicon electrode section are repsectively covered by thin oxide films 103 and 106.

Then, a relatively thick oxide insulating film 107 having a thickness of about 4,000 to 10,000 angstrom is deposited all over the surface of the silicon substrate 101 by the CVD process (chemical vapor deposition process). Usually, the insulating film 107 contains such impurity as phosphorous, boron, arsenic or the like and its surface shape is flattened when it is subjected to a heat treatment at a temperature of about 900° C. This described method of flattening the impurity containing insulating film 107 by the heat treatment is widely known as the "reflow treatment" and it has the effect of preventing the occurrence of electric failures (breaking, short-circuit, etc.,) of a metal wiring made of aluminum, aluminum alloy or the like and formed by the subsequent operation.

Figure 2B:
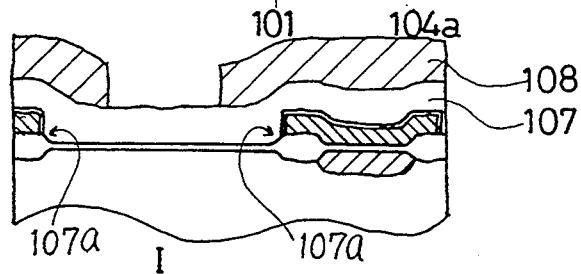

After the completion of the reflow treatment, a resist 108 is applied and then exposure and development treatments are effected. Then, a patterning is effected to remove the insulating film 107 at the regions which will form photosensitive cells. FIG. 2b shows the condition where the patterning has been completed.

Figure 2C:
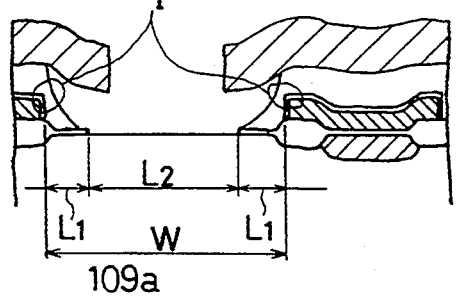

Next, the insulating film 107 and the thin thermal oxide film 103 are simultaneously removed by etching by means of a wet etching process and the surface of the silicon substrate 101 is exposed. The resulting condition is shown in FIG. 2c. Note that the processing operations of the above-mentioned FIGS. 2b and 2c will be described later in detail.

Figure 2D:
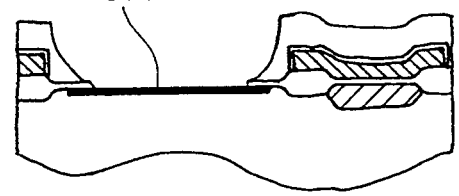

After the surface of the silicon substrate 101 within the photosensitive cell regions has been exposed, the stripping and cleaning of the resist 108 are effected and then photoelectric conversion portions of the photosensitive cells are formed. The operation of forming the photoelectric conversion portions of the photosensitive cells is such that the deposition of Pt on the exposed surface of the silicon substrate 101 within each photosensitive cell region is effected first and then a PtSi layer 109a is formed by a heat treatment. As a result, the photoelectric conversion portion of the photosensitive cell (the Schottky barrier diode) is formed. This condition is shown in FIG. 2d.

Figure 2E:
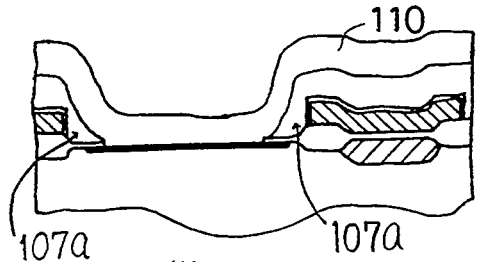

Thereafter, as shown in FIG. 2e, a relatively thick oxide insulating film 110 is again deposited over the whole surface by the CVC process. At this time, the same material as the previously mentioned insulating film 107 can be used as a material for the insulating film 110.

Figure 2F:
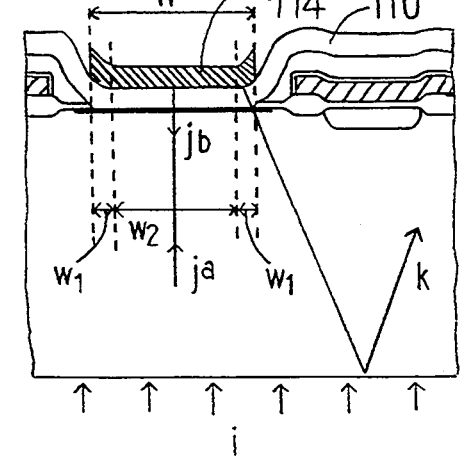

After the completion of the operation shown in FIG. 2e, as shown in FIG. 2f, a metal reflecting film 114 made of aluminum or aluminum alloy is formed on the surface of the insulating film 110 on each photosensitive cell. This metal reflecting film 114 is provided for such purposes that of the infrared light (indicated by arrows i in FIG. 2f) incident from the back side of the semiconductor chip, the infrared light transmitted through the PtSi layer 109a is again introduced into the PtSi layer 109a thereby improving the photosensitivity to the infrared light. In other words, while the PtSi layer 109a is so thin that about half amount of the incident light is transmitted, this transmitted light is returned to the PtSi layer 109a by the reflecting film 114 thereby improving the photosensitivity.

Lastly, a wiring layer (not shown) made of aluminum or aluminum alloy for driving infrared solid state imaging elements is formed thereby completing an infrared solid state imaging device.

A first problem of such conventional production method is as follows.

More specifically, in accordance with this conventional production method the insulating film 107 is flattened by the reflow treatment prior to the formation of the reflecting films 114 so that in the course of the flattening treatment, "sags and runners" 107a of the insulating film 107 are caused at the stepped portions in the lower part of the edges of the photosensitive cell region as shown in FIGS. 2b and 2e. As a result, as shown in FIG. 2f, the reflecting film 114 is flat in its central portion (a region $W_2$) but has a curved surface shape at its both ends (regions $W_1$).

When light is incident on the infrared solid state imaging device having such reflecting film shape in the direction indicated by arrows i in FIG. 2f, that is, light enters from the back side, the light incident on the region W2 as indicated by an arrow ja is reflected by the flat portion of the reflecting film 114 as indicated by an arrow jb so that it travels in the exactly opposite direction to the incident light and it again falls on the PtSi layer 109a. On the contrary, the light incident on each of the regions $W_1$ is reflected by the curved portion of the reflecting film 114 so that the incident light travels as indicated by an arrow k and it falls on another picture element after it has been photoelectrically converted by the PtSi layer 109a. In other words, this causes the occurrence of crosstalk and the production of an image output which is extremely hard to see.

In this case, while it is suffice to limit the formation of the reflecting film 114 only to the region $W_2$ if the prevention of crosstalk is simply desired, the non-presence of the reflecting film 114 in the regions $W_1$ has such effect that the light falling on the region $W_1$ and transmitting through the PtSi layer 109a is prevented from falling again on the photosensitive cell, thereby greatly deteriorating the photosensitivity.

A second problem of the conventional production method is as follows.

More specifically, describing the operations of FIGS. 2b and 2c in greater detail, in the solid state imaging device the photosensitive portions are the most important element active regions and there the presence of any damages such as crystal defects is not allowed. Therefore, the dry etching process tending to damage the silicon substrate 101 cannot be applied in the previously mentioned operation of forming openings in the oxide insulating film 107 by the CVD process (FIG. 2c). Thus, in accordance with the conventional production method the reflow treatment of the CVD oxide insulating film 107 (FIG. 2b) is effected first and then the formation of openings is effected by the wet etching process.

At this time, according to the wet etching process the etching proceeds at an equal rate in all the directions and therefore the resulting side etching is increased. In addition, if the insulating film 107 is very greatly reduced in thickness in the portions indicated by a symbol I in FIG. 2c, there is frequent occurrence of electric failure in the CCD transfer electrode 105 and therefore the resist 108 must be applied to the positions sufficiently entering into the inner side of the photosensitive cell. In other words, in FIG. 2c the dimensions $L_1$ must be increased with sufficient allowances and usually the dimensions $L_1$ are selected to be on the order of 5 to 2 $\mu$m.

Thus, if the width of the element active region which is to be formed into a photosensitive cell (W in FIG. 2c) is selected for example to be 10 $\mu$m, the width of a region where the effective portion of the photosensitive cell is to be formed ($L_2$ in FIG. 2c) is about 6 to 7 $\mu$m at the most.

In order to simultaneously satisfy the requirements for the solid state imaging device such as the reduced chip size, the improved spatial resolution (the increased picture element density) and the improved photosensitivity, it is necessary to increase the area ratio (opening ratio) occupied by the photosensitive cell within each unit picture element of the solid state imaging device and various attempts have been made. For example, decreasing the width of the isolation region 102 and decreasing the width of the BCCD diffused layer 104a shown in FIG. 2a may be cited. However, these attempts alone cannot satisfactorily improve the opening ratio and it is difficult to produce an imaging device having a high photosensitivity. Thus, it is desirable to reduce the value of the previously mentioned $L_1$ as far as possible, and in the case of the conventional solid state imaging device production method the side etching of the insulating film 107 is unavoidable as shown in FIG. 2c, thereby making it impossible to reduce the value of $L_1$.

First Embodiment

Referring now to FIGS. 3a to 3d, the method for producing a solid state imaging device according to a first embodiment of the present invention will now be described in greater detail. It is to be noted that the Figures show the surface and its vicinity of the section of a unit picture element in an infrared solid state imaging device and the Figures are shown in the corresponding scale to that of the previously mentioned FIGS. 2a to 2f for the purposes of comparison.

Firstly, an isolation region 2 made of a relatively thick oxide film is formed on a silicon substrate 1 by the hethertofore well known LOCOS isolation process (localized oxidation of silicon isolation process).

Figure 3A:
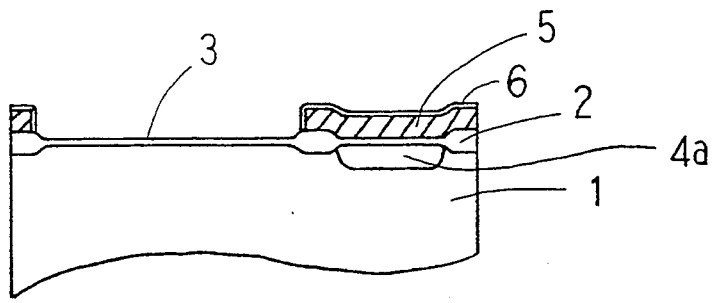
FIGS. 3a to 3d are partial sectional views showing the construction of a solid state imaging device at various stages of its production process according to a first embodiment of the present invention.

Next, BCCD diffused layers 4 are formed in the charge transfer channel by the normal procedure and CCD transfer electrodes 5 made of polysilicon are formed on the diffused layer 4a. In addition, though not shown in the Figure, all of the various thermal diffused layers such as source/drain diffused layers forming MOS transistors in the output section of the charge transfer channel and all the polysilicon electrodes are formed. FIG. 3a shows the condition where the formation of the thermal diffused layers and the polysilicon electrodes has been completed. Note that at this time, the photosensitive cell regions and the polysilicon electrode regions are respectively covered by thin oxide films 3 and 6.

Figure 3B:
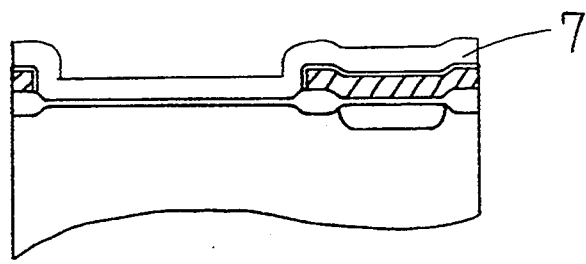

Next, an insulating film 7 obtainable at a relatively low temperature of about 500° C. or less is formed over the whole surface, thereby obtaining the sectional structure shown in FIG. 3b. This insulating film 7 may be selected from a variety of films such as an oxide film, oxide nitride film or nitride film made by the atmospheric pressure CVD process, the plasma CVD process, the low pressure CVD process or the sputtering process and the operation is proceeded to the next step without effecting the reflow treatment.

Figure 3C:
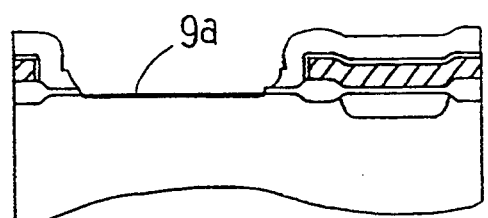

Then, holes are opened in the insulating film 7 and the oxide film 3 by a photolithographic operation for the formation of photosensitive cells and a wet etching operation, and then the deposition of Pt and a heat treatment are effected thereby forming a PtSi layer 9a. As a result, a photoelectric conversion portion (Schottky barrier diode) is formed. The resulting condition is shown in FIG. 3c.

Next, an insulating film 10 obtainable at a relatively low temperature of about 500° C. or less is again formed over the whole surface. This insulating film 10 may also be selected from a variety of films such as an oxide film, an oxide nitride film, a nitride film, etc., made by the atmospheric pressure CVD process, the plasma CVD process, the low pressure CVD process, the sputtering process, etc., as in the case of the insulating film 7.

Thereafter, a reflecting film 11 is formed by depositing for example aluminum, aluminum alloy or the like on the surface of the insulating film 10 or each photosensitive cell.

Then, an insulating film 12 which is also obtainable at a relatively low temperature of about 500° C. or less but having a flat surface is formed over the whole surface.

Figure 3D:
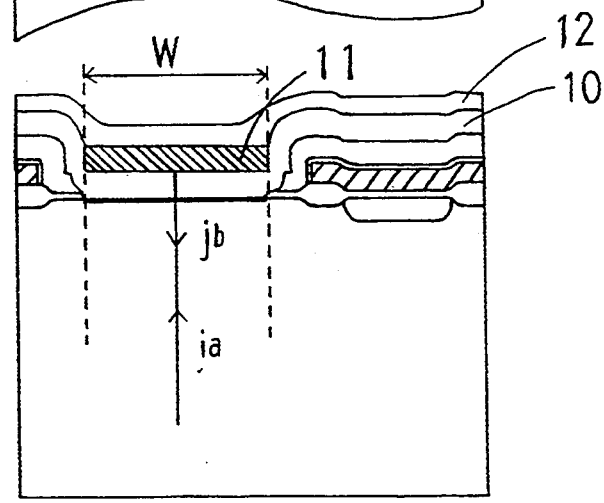

This insulating film 12 may be selected from a variety of films including for example a polyimide film made by subjecting a liquid polyimide resin to spin coating and a heat treatment, a spin-on glass (SOG) film, an oxide film by the CVD process, particularly a CVD oxide film mainly made of such material as tetraethoxysilane (TEOS), etc. FIG. 3d shows the condition in which the insulating film 12 is formed and its surface is flattened.

Lastly, a wiring layer (not shown) made of aluminum or aluminum alloy for driving a solid state imaging device is formed on the flattened surface of the insulating film 12 thereby completing the solid state imaging device.

Thus, in accordance with the production method of the present embodiment the reflecting film 11, which is to be formed on each photosensitive cell, is formed on the insulating film 10 undergoing no flattening treatment or having no "sags and runners" at the stepped portions so that differing from the device by the conventional production method, the reflecting film 11 is not curved at the marginal portions and it has a uniformly flat shape over the whole region W of the photosensitive cell.

Thus, as shown in FIG. 3d, in the imaging device produced by the present production method, if the light ja falling on the photoelectric conversion portion of the photosensitive cell from the lower surface of the substrate all the light passed through the photoelectric conversion portion is reflected from the reflecting film 11 all over the effective region of the photosensitive cell and the resulting reflected light jb is again photoelectrically converted by the photosensitive cell, thus preventing the reflected light jb from falling on another photosensitive cell and thereby effectively preventing the occurrence of crosstalk.

Further, in accordance with this device an almost completely flat reflecting film can be uniformly formed all over the whole region W of each photosensitive cell up to its marginal edges so that the light transmitted through the photoelectric conversion portion of the photosensitive cell is practically entirely directed again to the photoelectric conversion portion of the same photosensitive cell and the photosensitivity is improved to an extremely high level, thereby contributing toward greatly increasing the field of utilization of the solid state imaging device.

Second Embodiment

A method for producing a solid state imaging device according to a second embodiment of the present invention will now be described with reference to FIGS. 4a to 4f. It is to be noted that these Figures are partial sectional views each showing the surface and its neighbourhood of a unit picture element of a solid state imaging device as in the case of FIGS. 2 and 3 and the picture element is shown on the corresponding scale to that of FIGS. 2 and 3 for purposes of comparison.

Figure 4A:
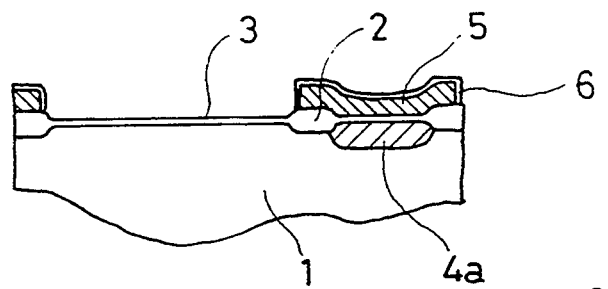
FIGS. 4a to 4f are partial sectional views showing the construction of a solid state imaging device at various stages of its production process according to a second embodiment of the present invention.

FIG. 4a is the similar sectional view to the previously explained FIG. 3a and it shows the condition where isolation regions 2, BCCD diffused layers 4a, CCD transfer electrodes 5 and thin oxide films 3 and 6 are formed on a silicon substrate 1 and all of various thermal diffused layer and all polysilicon electrodes are also formed.

Figure 4B:
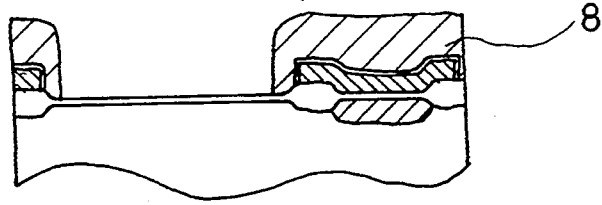
Figure 4C:
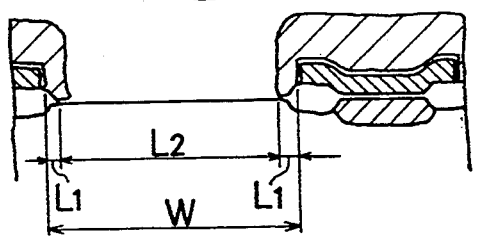

Then, in accordance with the present embodiment a lithographic operation for the formation of photosensitive cells is effected. More specifically, a resist 8 is applied and then its exposure and development are effected to effect the patterning of the resist 8 and thereby to protect the whole area other than element active regions for forming the effective photosensitive portions of the photosensitive cells by the resist 8. The resulting condition is shown in FIG. 4b.

Then, holes are opened in the oxide film 3 by the wet etching process and the surface of the silicon substrate 1 is exposed at the element active regions. At this time, according to the present embodiment it is only necessary to subject the thin oxide film 3 (this is also referred to as a gate oxide film and its thickness is usually 2,000 angstrom or less) to the wet etching and the amount of side etching is extremely small. As a result, the dimensions L, shown in FIG. 4c can be set to about 0.5 μm even if an allowance is afforded. Thus, if the width dimension (W in FIG. 4c) of the element active regions as the effective photosensitive portions is selected 10 μm, the width dimension ($L_2$ in FIG. 4c) of the regions to be actually formed as the effective photosensitive portions in the present embodiment becomes about 9 μm and therefore the effective area of the photosensitive cells can be considerably increased as compared with the conventional device shown in FIG. 2 ($L_2$=6 to 7 μm) even if the unit picture elements are the same in size.

Figure 4D:
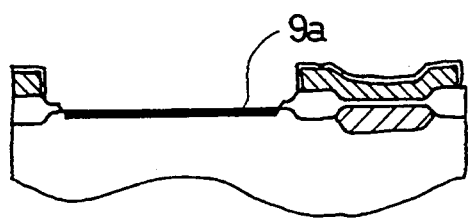

Thereafter, the stripping and cleaning of the resist 8 are effected and the formation of photoelectric conversion portions of photosensitive cells follows. In the formation of photosensitive cells, the deposition of Pt on the exposed surface portions of the silicon substrate is effected first and then PtSi layers 9a are formed by a heat treatment. As a result, photoelectric conversion portions (Schottky barrier diodes) are formed. This condition is shown in FIG. 4d.

Then, an insulating film 10 obtainable at a relatively low temperature of 500° C. or less is formed over the whole surface. This insulating film 10 may be selected from a variety of films such as an oxide film, an oxide nitride film and a nitride film made by the atmospheric pressure CVD process, the plasma CVD process, the low pressure CVD process and the sputtering process.

Figure 4E:
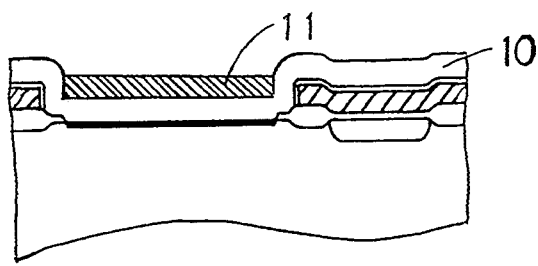

Thereafter, a reflecting film 11 is formed by aluminum, aluminum alloy or the like on the surface of the insulating film 10 on each photosensitive cell and a sectional structure such as shown in FIG. 4e is obtained.

Figure 4F:
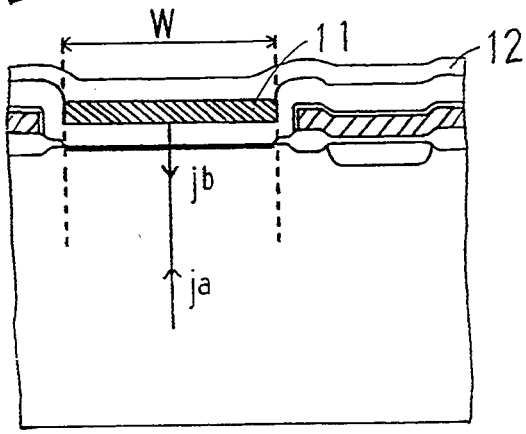

Next, an insulating film 12, which is obtainable at a relatively low temperature of 500° C. or less and which is now flat, is formed over the whole surface. This insulating film 12 may be selected from a variety of films including a polyimide film formed by spin coating a liquid polyimide resin and subjecting it to a heat treatment, a spin-on glass (SOG) film, an oxide film by the CVD process, particularly a CVD oxide film using tetraethoxysilane (TEOS) as a main material, etc. FIG. 4f shows the condition in which the insulating film 12 is formed and its surface is flattened.

Finally, an aluminum or aluminum alloy wiring layer (not shown) for driving an infrared solid state imaging device is formed on the flattened insulating film 12, thereby completing the infrared solid state imaging device.

From the foregoing it will be seen that in accordance with the production method of this embodiment the reflecting film 11 formed on each photosensitive cell is also formed on the insulating film 10 which is not subjected to the flattening treatment or having no "sags and runners" at stepped portions so that differing from the device by the conventional production method, the reflecting film 11 is not curved at the marginal portions and it has a uniform flat shape over the whole effective photosensitive region W of the photosensitive cell.

As a result, in the imaging device produced by this production method, as shown in FIG. 4f, if the light ja incident on the photoelectric conversion portion of the photosensitive cell from the lower surface side of the substrate the light passed through the photoelectric conversion portion is reflected from the reflecting film all over the effective region of the photosensitive cell so that the reflected light jb is again photoelectrically converted by the same photosensitive cell and therefore the reflected light jb is prevented from falling on another photosensitive cell, thereby effectively preventing the occurrence of crosstalk.

Further, in the present device the reflecting film, which is substantially completely flat, is formed uniformly all over the whole region W up to the marginal ends of the photosensitive cell so that practically all the light passed through the photoelectric conversion portion of each photosensitive cell is again directed to the photoelectric conversion portion of the same photosensitive cell and thus the photosensitivity is enhanced to an extremely high level, thereby contributing toward greatly increasing the field of utilization of the solid state imaging device.

Third Embodiment

A method for producing a solid state imaging device according to a third embodiment of the present invention will now be described with reference to FIGS. 5a to 5d. It is to be noted that the Figures are partial sectional views each showing the surface and its neighbourhood of a unit picture element of a solid state imaging device as in the case of FIGS. 3 and 4, and the Figures are shown in the corresponding scale to that of FIGS. 3 and 4 for the purpose of comparison therewith. Also, FIG. 6 shows schematically a partial plane construction of an infrared solid state imaging device obtainable in accordance with the present embodiment.

Figure 5A:
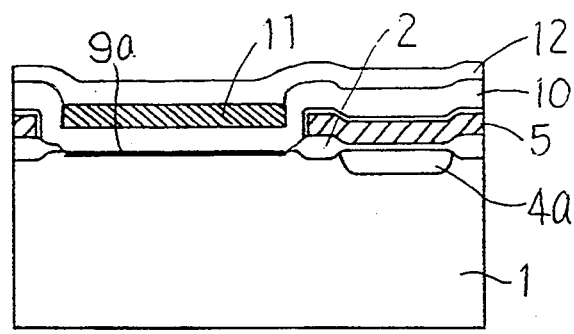
FIGS. 5a to 5d are partial sectional views showing the construction of a solid state imaging device at various stages of its production process according to a third embodiment of the present invention.
Figure 6:
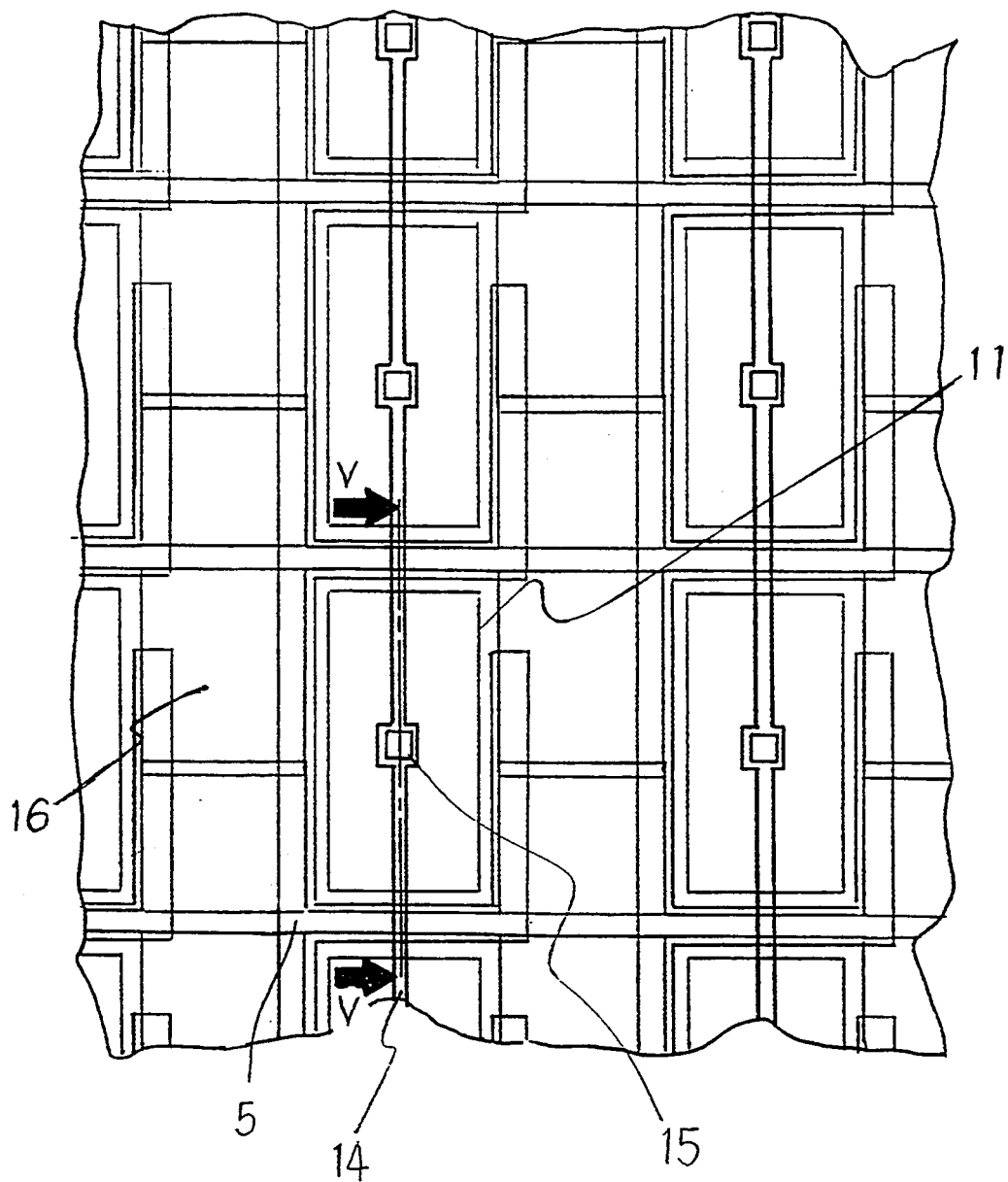
FIG. 6 is a partial plan view showing schematically the construction of a solid state imaging device produced according to the third embodiment.

FIG. 5a shows the similar sectional view to the previously explained FIG. 4f and the preceeding production steps are the same as FIGS. 4a to 4e, respectively. Also, the starting construction of the present embodiment shown in FIG. 5a is not limited to the construction of FIG. 4f and instead the construction shown in FIG. 3d may be used.

Figure 5B:
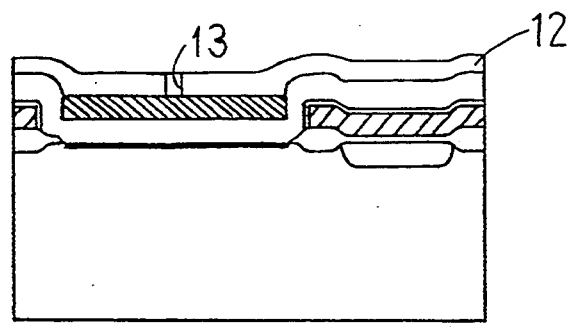

In accordance with the present embodiment, in the starting construction shown in FIG. 5a a through hole 13 having a relatively small diameter and reaching the reflecting film 11 is formed first by the ordinary photolithographic procedure in the insulating film 12 having the flattened surface at those portions each corresponding to one of the photosensitive cells (FIG. 5b).

Figure 5C:
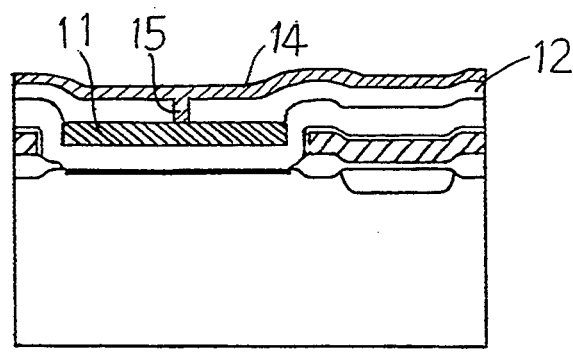
Figure 5D:
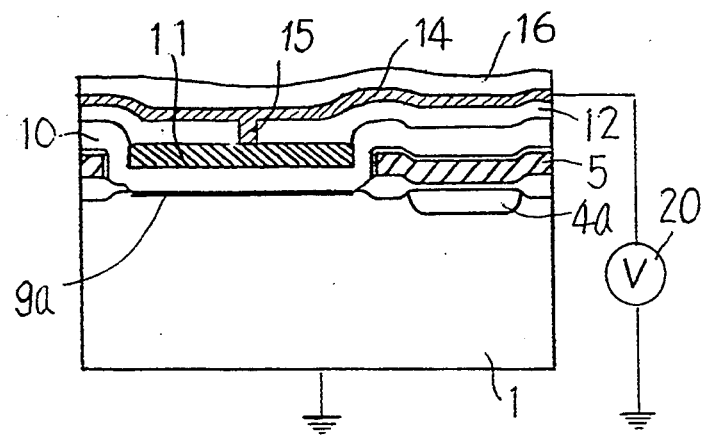

Following the formation of the through holes 13, a metal thin film 14 made of aluminum or aluminum alloy is formed on the flattened surface of the insulating film 12 to bridge the through hole portions by the photolithographic procedure. Thus, as shown in FIG. 5c, conductive portions 15 made of the aluminum or aluminum alloy in the through holes 13 are formed simultaneously and the metal thin film 14 and the reflecting films 11 are electrically connected by the conductive portions 15. Then, the whole surface is covered with an insulating film 16 and the construction such as shown in FIG. 5d is completed.

FIG. 6 shows a schematic plane construction of resulting condition. It is to be noted that the sectional constructions of FIGS. 5a to 5d corresponds to the sectional views taken along the line V—V of FIG. 6. In FIG. 6, the plurality of photosensitive cells are each provided with the metal reflecting film 11 and the photoelectric conversion portion composed of the semiconductor Schottky junction is present below each of the reflecting films 11. These metal reflecting films 11 are electrically connected to the metal thin film 14 of a wiring form by the conductive portions 15 and all the reflecting films 11 are maintained at the same positive potential by a DC voltage applied to the metal thin film 14 from an external DC power source 20 as shown in FIG. 5d.

This embodiment is similar to the previously mentioned first and second embodiments with respect to the manner in which the incident light falls as indicated by the arrows from the lower surface of the silicon substrate 1 and it is received. However, all the metal reflecting films 11 of the imaging device are maintained at the same positive potential by the DC power source 20 through the metal thin film 14 and thus there is caused no nonuniformity in photosensitive characteristic among the photosensitive cells. Also, even if negative charges are established in the reflecting films 11 by the cleaning or the like, the reflecting films 11 are biased to the predetermined potential by the DC power source 20 so that the electrification of negative charges is eliminated or cancelled and the uniform photosensitive characteristic is ensured for all the photosensitive cells. Further, in accordance with the present embodiment, due to the fact that it is possible to increase the electrostatic capacity of the photoelectric conversion portion or the semiconductor Schottky junction of each of the photosensitive cells, there is the advantage that the maximum storage quantity of charges produced by photoelectric conversion can be increased and thus the dynamic range for the photoelectric conversion of each photosensitive cell can be increased.

Fourth Embodiment

Figure 7A:
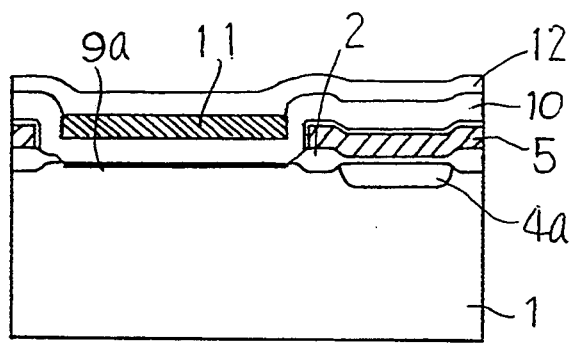
FIGS. 7a to 7c are partial sectional views showing the construction of a solid state imaging device according to a fourth embodiment of the present invention.
Figure 7B:
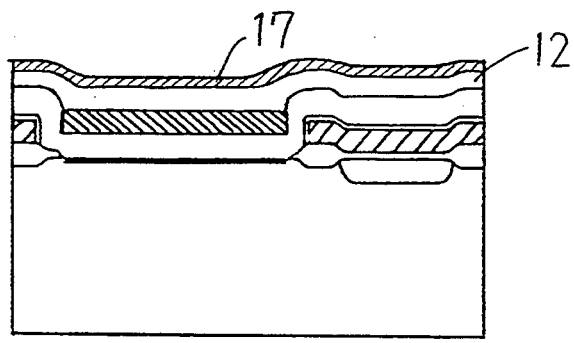
Figure 7C:
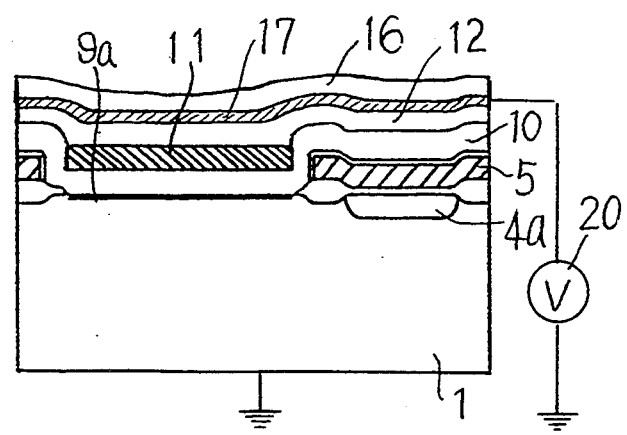

Referring now to FIGS. 7a to 7c, a method for producing a solid-state imaging device according to a fourth embodiment of the present invention will be described. It is to be noted that the Figures are partial sectional views each showing the surface and its neighbourhood of a unit picture element of a solid state imaging device as in the case of FIGS. 3 and 4 and the Figures are shown in the corresponding scale to that of FIGS. 3 and 4 for the purposes of comparison therewith. Also, FIG. 8 shows schematically a partial plane construction of an infrared solid state imaging device obtainable according to the present embodiment.

FIG. 7a is the similar sectional view to the previously explained FIG. 4f and the preceeding production steps are respectively the same as FIGS. 4a to 4e. Also, the starting construction of the present embodiment shown in FIG. 7a is not limited to the construction of FIG. 4f and instead the construction shown in FIG. 3d may be used.

In accordance with the present embodiment, in the starting construction shown in FIG. 7a a solid metal thin film 17 having an electrode portion of substantially the same planar shape as the reflecting film 11 at each of the photosensitive cell portions of the insulating film 12 having the flattened surface, is first formed by using aluminum or aluminum alloy on the flattened surface of the insulating film 12 in accordance with the ordinary photolithographic procedure. As a result, each of the electrode portions of the metal thin film 17 is conditioned for capacitive coupling with one of the reflecting films 11 as shown in FIG. 7b. Thereafter, the whole surface is covered with an insulating film 16 thereby completing the construction such as shown in FIG. 7c.

Figure 8:
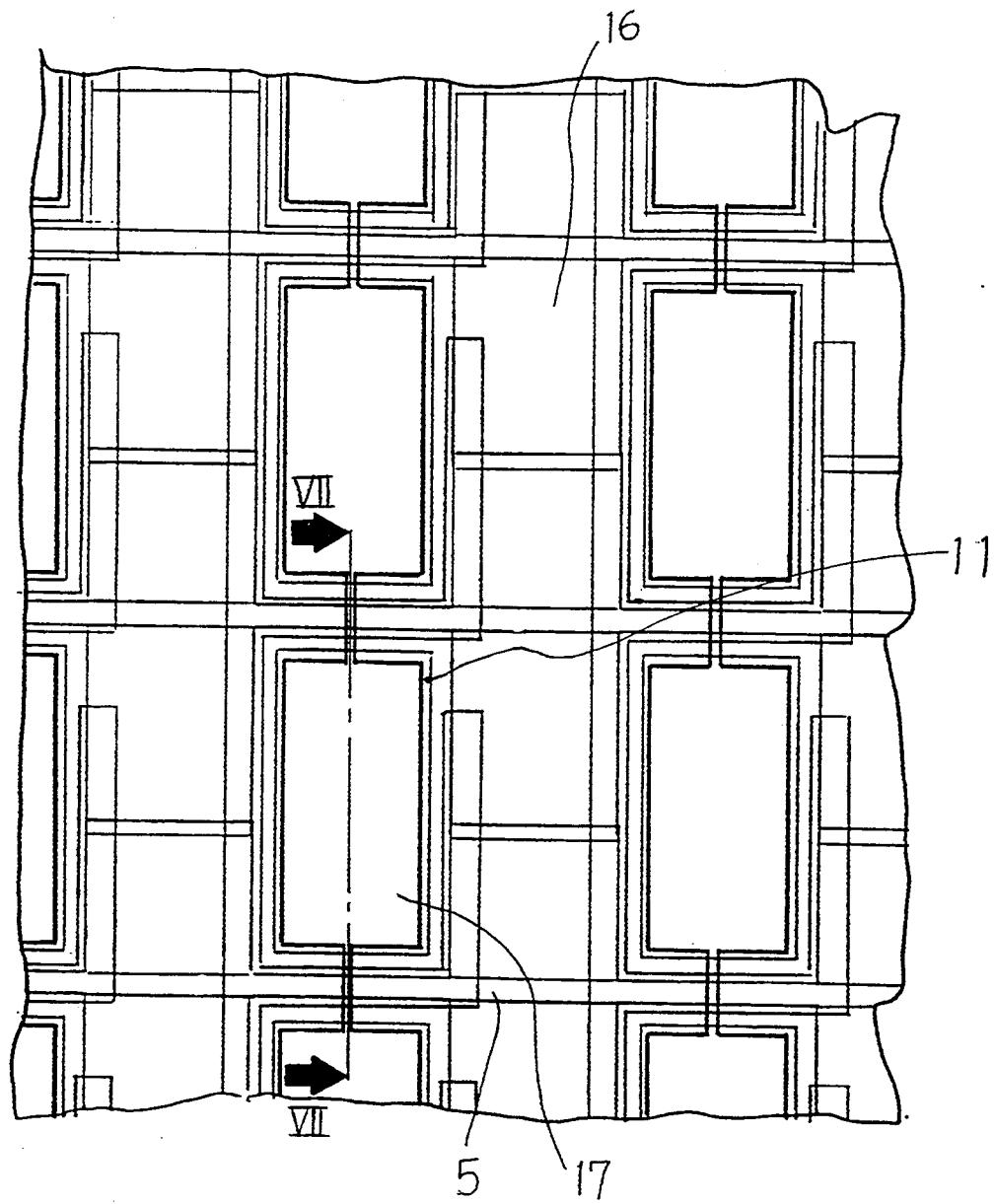
FIG. 8 is a partial plan view showing schematically the construction of a solid state imaging device produced according to the fourth embodiment.

FIG. 8 shows schematically the plane construction of the resulting condition. It is to be noted that the sectional constructions shown in FIGS. 7a to 7c correspond to the sectional views taken along the line VII—VII of FIG. 8. In FIG. 8, the plurality of photosensitive cells are each provided with one of the metal reflecting films 11 and the photoelectric conversion portion composed of the semiconductor Schottky junction is present below the reflecting film 11. Each of the metal reflecting films 11 is capacitively coupled to one of the electrode portions of the metal thin film 17 facing thereto through the insulating film 12 and all the reflecting films 11 are maintained at the same positive potential by a DC voltage applied to the metal thin film 17 from an external DC power source 20 as shown in FIG. 7c.

The present embodiment is similar to the previously mentioned first and second embodiments with respect to the manner in which the incident light is introduced as shown by the arrows i from the lower surface of the silicon substrate 1 and received. However, all the metal reflecting films 11 of the imaging device are electrostatically shielded by the metal thin film 17 and the semiconductor substrate 1 and they are also capacitively coupled to the metal thin film 17 connected to the DC power source 20 so as to be maintained at the same positive potential, thereby preventing the occurrence of nonuniformity in photosensitive characteristic among the photosensitive cells. Also, even negative charges are established in the reflecting films 11 by the cleaning or the like, the electrification of negative charges is eliminated or cancelled due to their electrification at the predetermined potential by the DC power source 20 thereby ensuring the uniform photosensitive characteristic for all the photosensitive cells.

In this case, the positive potential applied to the metal reflecting films 11 by the capacitive coupling can be increased with decrease in the thickness of the insulating film 12 between the metal reflecting films 11 and the metal thin film 17. Also, if the interlayer insulating film 12 is made for example of a silicon nitride film, its dielectric constant is high as compared with the silicon oxide film and thus a stronger capacitive coupling is realized for the same film thickness.

In accordance with the present embodiment, the formation of the through holes 13 as in the case of the third embodiment is not needed so that there is no need to consider the reduction in yield due to the formation of the through holes and there is an excellent effect in terms of mass productivity. Also, since there is no need to increase the amount of overlapping between the guard ring diffused layer formed around the semiconductor Schottky junction of each photosensitive cell and the Schottky junction and since there is no need to increase the impurity density of the guard ring diffused layer, the opening ratio of the photosensitive cells can be improved and thus it is possible to produce an imaging device which is high in sensitivity and high in picture element density. Also, in accordance with the present embodiment it is possible to increase the electrostatic capacity of the photoelectric conversion portion composed of the semiconductor Schottky junction of each photosensitive cell and thus there is the advantage that it is possible to increase the maximum storage quantity of charges produced by the photoelectric conversion and that the dynamic range of photoelectric conversion of each photosensitive cell can be increased.

It is to be noted that while the previously mentioned embodiments have been described by way of an infrared solid state imaging device, it is needless to say that the present invention is not limited to the infrared solid state imaging device. In addition, the photosensitive portions are not limited to PtSi and they may be any other silicide (e.g., palladium silicide or indium silicide) or any other substance (e.g., compound semiconductor such as GaAs, CdTe, InSb or InAs or such fluorides as $CaF_2$).

Further, it will be seen from the purports of the present invention that the charge read-out channel is not limited to the CCD type, that is, it may be any of other types such as the MOS type, CSD type or CPD type and that the reflecting films are also not limited to aluminum or aluminum alloy and they may be made of any other material provided that the incident light is internally reflected.

What is claimed is:

1. A solid state imaging device comprising:
   a semiconductor substrate;
   a plurality of photosensitive cells, each of which includes a photoelectric conversion layer disposed on a first principal surface of said semiconductor substrate and a dielectric isolation layer surrounding said photoelectric conversion layer;
   electrode means formed in a gap area among said photosensitive cells for transferring charges produced below said first principal surface of said semiconductor substrate to the outside for the purpose of reading said changes;
   a first insulating film covering an area containing said photosensitive cells and having a substantially uniform thickness on said photoelectric conversion layer;
   a plurality of metal reflecting films formed on said first insulating film in such a manner that the whole surface of each of said metal reflecting films forms a reflecting surface substantially parallel to a surface of said photoelectric conversion layer which is disposed on the first principal surface whereby light passed through said photoelectric conversion layer from a side opposite to said first principal surface is reflected back to said photoelectric conversion layer, respectively;
   a second insulating film covering an area containing said electrode means and said metal reflecting films and having a flattened surface; and
   a metal wiring formed on the flattened surface of said second insulating film for driving said electrode means.

2. A solid state imaging device according to claim 1, wherein said semiconductor substrate comprises a silicon substrate, and wherein said photoelectric conversion layer forms a semiconductor Schottky junction made of a metal silicide deposited on an exposed portion of said first principal surface of said silicon substrate.

3. A solid state imaging device according to claim 1, wherein said photoelectric conversion layer is disposed directly on said first principal surface of said semiconductor substrate.

4. A solid state imaging device according to claim 1, wherein said second insulating film is composed of a polyimide film.

5. A solid state imaging device according to claim 1, wherein said second insulating film is composed of a spin-on glass film.

6. A solid state imaging device according to claim 1, wherein said second insulating film is composed of an oxide film formed by means of a chemical vapor deposition process.

7. A solid state imaging device comprising:
- a semiconductor substrate;
- a plurality of photosensitive cells each of which includes a photoelectric conversion layer disposed on a first principal surface of said semiconductor substrate and a dielectric isolation layer surrounding said photoelectric conversion layer;
- electrode means formed in a gap area among said photosensitive cells for transferring charges produced below said first principal surface of said semiconductor substrate to the outside for the purpose of reading said charges;
- a first insulating film covering an area containing said photosensitive cells and having a substantially uniform thickness on said photoelectric conversion layer;
- a plurality of metal reflecting films formed on said first insulating film in such a manner that the whole surface of each of said metal reflecting films forms a reflecting surface substantially parallel to a surface of said photoelectric conversion layer which is disposed on the first principal surface whereby light passed through said photoelectric conversion layer from a side opposite to said first principal surface is reflected back to said photoelectric conversion layer, respectively;
- a second insulating film covering an area containing said electrode means and said metal reflecting films and having a flattened surface;
- a plurality of through holes formed in said second insulating film and each reaching each of said metal reflecting films;
- a metal wiring formed on the flattened surface of said second insulating film for driving said electrode means; and
- a metal thin film formed on said Second insulating film for maintaining said metal reflecting films in common at a predetermined potential through said through holes so as to prevent the electrification of charges in said metal reflecting films due to static electricity.

8. A solid state imaging device according to claim 7, wherein said photoelectric conversion layer is disposed directly on said first principal surface of said semiconductor substrate.

9. A solid state imaging device according to claim 7, wherein said second insulating film is composed of a polyimide film.

10. A solid state imaging device according to claim 7, wherein said second insulating film is composed of a spin-on glass film.

11. A solid state imaging device according to claim 7, wherein said second insulating film is composed of an oxide film formed by means of a chemical vapor deposition process.

12. A solid state imaging device comprising:
- a semiconductor substrate;
- a plurality of photosensitive cells formed on a side of a first principal surface of said semiconductor substrate, each of said photosensitive cells being surrounded by a dielectric isolation layer;
- electrode means formed in a gap area among said photosensitive cells for transferring charges produced below said first principal surface of said substrate to the outside;
- a first insulating film covering an area containing said photosensitive cells with a substantially uniform thickness;
- a plurality of metal reflecting films formed on said first insulating film in such a manner that the whole surface of each of said metal reflecting films forms a reflecting surface substantially parallel to a surface of each of said photosensitive cells which is on the side of said first principal surface whereby light passed through each of said photosensitive cells from a side opposite to said first principal surface is reflected back to each of said photosensitive cells, respectively;
- a second insulating film covering an area containing said electrode means and said metal reflecting films and having a flattened surface; and
- a metal thin film formed on the flattened surface of said second insulating film to face said metal reflecting films whereby said metal reflecting films are maintained at a predetermined potential;
- said metal thin film being insulated in terms of DC electricity and capacitively coupled in terms of AC electricity to said metal reflecting films by said second insulating film whereby said metal reflecting films are maintained at a predetermined potential in accordance with a potential externally applied to said metal thin film.

13. A solid state imaging device comprising:
- a semiconductor substrate;
- a plurality of photosensitive cells, each of which includes a photoelectric conversion layer disposed on a first principal surface of said semiconductor substrate and a dielectric isolation layer surrounding said photoelectric conversion layer;
- electrode means formed in a gap area among said photosensitive cells for transferring charges produced below said first principal surface of said semiconductor substrate to the outside for the purpose of reading said charges;
- a first insulating film covering an area containing said photosensitive cells and having a substantially uniform thickness on said photoelectric conversion layer;
- a plurality of metal reflecting films formed on said first insulating film in such a manner that the whole surface of each of said metal reflecting films forms a reflecting surface substantially parallel to a surface of said photoelectric conversion layer which is disposed on the first principal surface whereby light passed through said photoelectric conversion layer from a side opposite to said first principal surface is reflected back to said photoelectric conversion layer, respectively;
- a second insulating film covering an area containing said electrode means and said metal reflecting films and having a flattened surface;
- a metal wiring formed on the flattened surface of said second insulating film for driving said electrode means; and
- a metal thin film formed on said second insulating film to face said metal reflecting films, said metal thin film being insulated in terms of DC electricity and capacitively coupled in terms of AC electricity to said metal reflecting films by said second insulating film whereby said metal reflecting films are maintained in common at a predetermined potential in accordance with a potential externally applied to said metal thin film.

14. A solid state imaging device according to claim 13, wherein said photoelectric conversion layer is disposed directly on said first principal surface of said semiconductor substrate.

15. A solid state imaging device according to claim 13, wherein said second insulating film is composed of a polyimide film.

16. A solid state imaging device according to claim 13, wherein said second insulating film is composed of a spin-on glass film.

17. A solid state imaging device according to claim 13, wherein said second insulating film is composed of an oxide film formed by means of a chemical vapor deposition process.

* * * * *